United States Patent [19]

Person

[11] Patent Number: 5,075,867

[45] Date of Patent: Dec. 24, 1991

[54] METHOD FOR LIMITING SPURIOUS RESONANT CAVITY EFFECTS IN ELECTRONIC EQUIPMENT

[75] Inventor: George A. Person, Phoenix, Ariz.

[73] Assignee: Bull HN Information Systems Inc., Phoenix, Ariz.

[21] Appl. No.: 290,074

[22] Filed: Dec. 23, 1988

[51] Int. Cl.[5] .................... H05K 13/00; H05K 10/00; H05K 5/00

[52] U.S. Cl. .................................. 364/512; 361/390; 361/331

[58] Field of Search ............... 181/202, 175; 361/331, 361/390, 113, 1; 364/512; 312/352; 369/80; 357/74; 333/12, 247, 246, 228

[56] References Cited

U.S. PATENT DOCUMENTS

| | | | |
|---|---|---|---|
| 2,293,839 | 8/1942 | Linder | 174/35 R |
| 2,296,678 | 9/1942 | Linder | 174/35 R |
| 2,487,547 | 11/1949 | Harvey | 174/35 R |
| 4,137,441 | 1/1979 | Bucksbaum | 219/10.55 D |
| 4,268,803 | 5/1981 | Childs et al. | 333/12 |
| 4,408,255 | 10/1983 | Adkins | 174/35 MS X |
| 4,502,047 | 2/1985 | Fujiwara et al. | 361/390 |
| 4,694,265 | 9/1987 | Kupper | 333/12 X |
| 4,713,634 | 12/1987 | Yamamura | 333/247 X |
| 4,884,171 | 11/1989 | Maserang et al. | 333/12 X |
| 4,885,573 | 12/1989 | Fry et al. | 340/519 |

OTHER PUBLICATIONS

"The Incremental Method of Computer Shielding", J. L. Steenburgh, Computer Design/Oct. 1969.

"Taming EMI in Microprocessor Systems" by White et al., IEEE Spectrum, Dec. 1985, pp. 30–37.

*Primary Examiner*—Parshotam S. Lall
*Assistant Examiner*—S. A. Melnich
*Attorney, Agent, or Firm*—J. S. Solakian; J. H. Phillips

[57] ABSTRACT

Spurious cavity resonance effects in a cabinet housing electronics circuitry are suppressed by determining the maximum repetition rate or frequency for legitimate signals which can appear in the circuitry and then establishing the dimensions of each cavity within the cabinet such that each cavity's resonant frequency is higher than the critical repetition rate/frequency. Since a given cavity in a cabinet is typically block-shaped (such as the space between a cabinet door and the circuit panel facing the door), a special purpose formula may be employed to obtain a good approximation of the cavity's resonant frequency, and the cavity dimensions then adjusted to raise the cavity resonant frequency above the critical frequency. For the still more particular cavity configuration in which the length is greater than the width which is much greater than the depth, a further simplified formula can be employed to find an approximate cavity resonant frequency. In addition, for the common configuration in which one or more significant intrusions reduce the cavity volume, a more complex formula may be employed to find its approximate resonant frequency with the cavity dimensions then being adjusted to raise that approximate resonant frequency above the critical frequency. The method may be employed either in the design stage or at a remedial stage.

8 Claims, 2 Drawing Sheets

FIG. 1
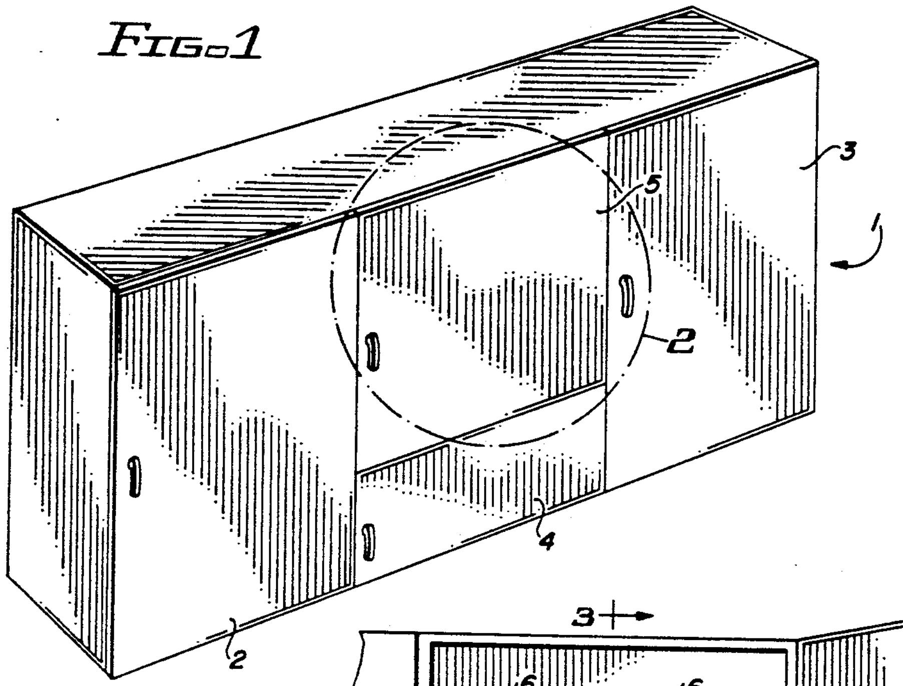
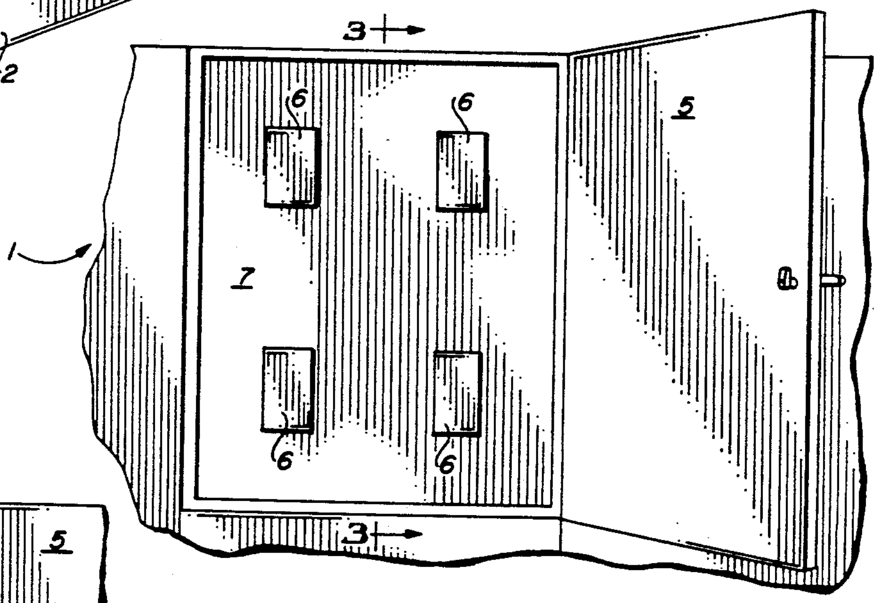
FIG. 2
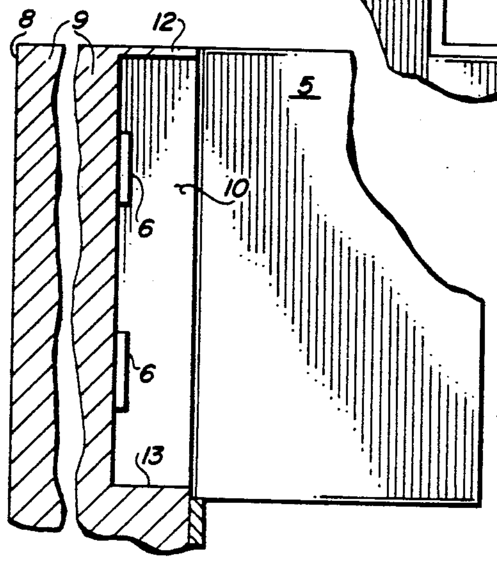
FIG. 3

FIG. 4
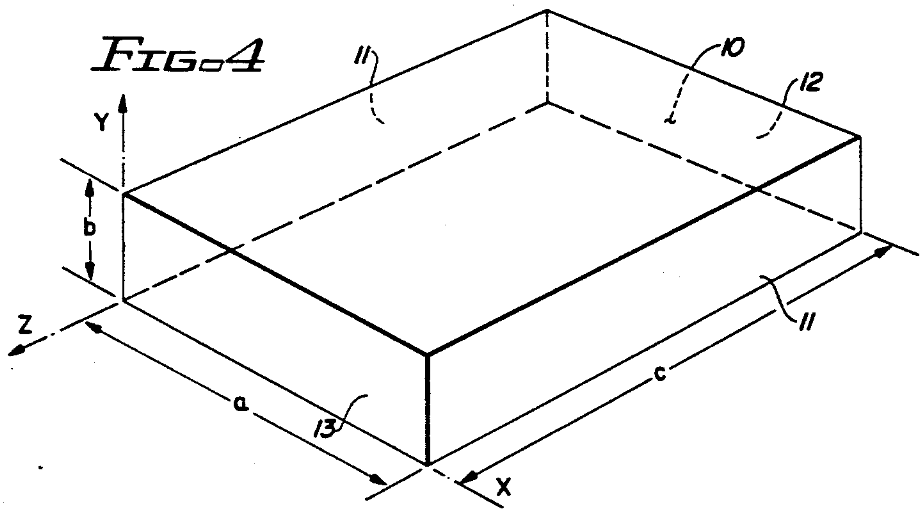
FIG. 5
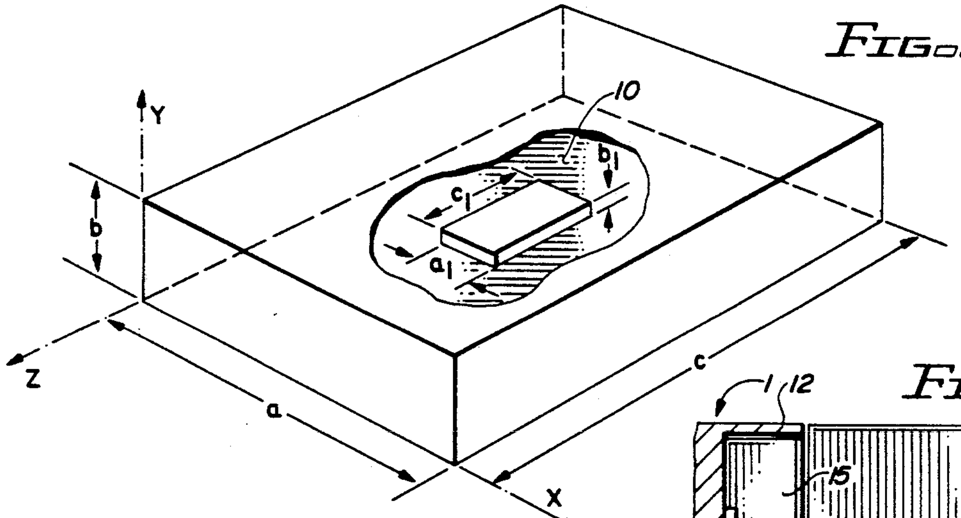
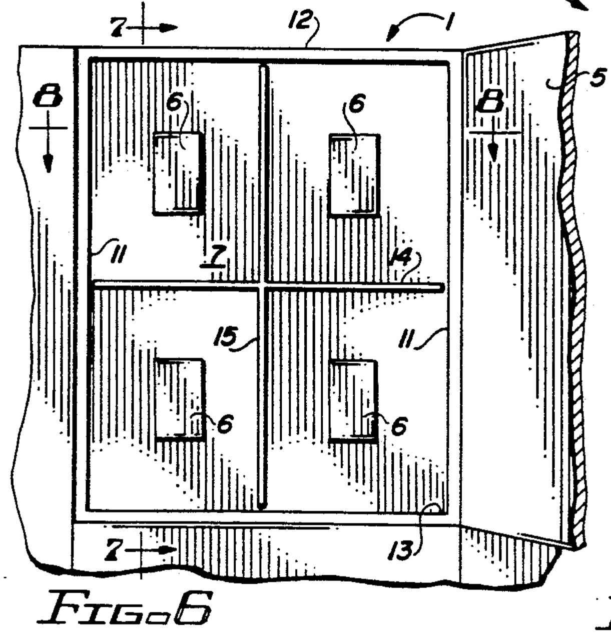
FIG. 6
FIG. 7
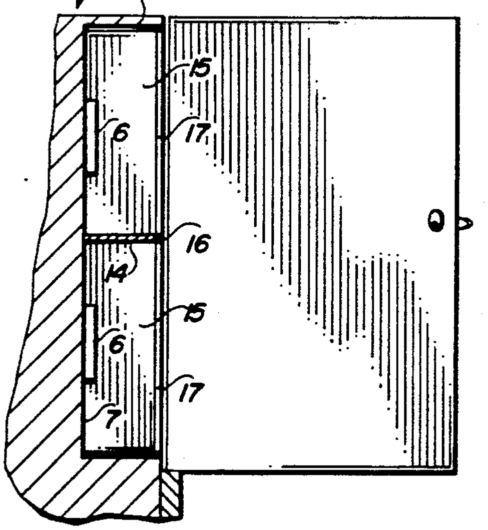
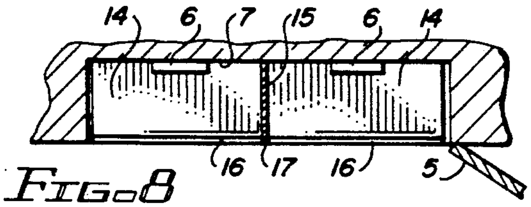
FIG. 8

METHOD FOR LIMITING SPURIOUS RESONANT CAVITY EFFECTS IN ELECTRONIC EQUIPMENT

FIELD OF THE INVENTION

This invention relates to the art of electronics and, more particularly, to a method for limiting spurious resonant cavity effects in electronics circuitry operating at high repetition rates and housed within an electrically conductive cabinet. A typical environment for practicing the invention is in digital computer systems.

BACKGROUND OF THE INVENTION

The progress of the art of electronics, particularly the advances in information processing systems, have been characterized in one aspect by ever increasing speeds of operation at the state of the art. As the speed of operation, or operating frequencies, of such systems has increased, hitherto unencountered problems have arisen such that, in many instances, extremely transient and elusive failures occur for no known reason. The present invention is directed to the solution of an exceptionally subtle problem which, itself, does not appear to have been recognized previously.

The problem to whose solution the present invention is directed constitutes the inadvertent creation of resonant cavities within a cabinet housing electronic equipment operating within a critical frequency range whereby standing waves may transiently develop and sweep across vulnerable regions of the circuitry, such as contact pads, to thereby raise the possibility of randomly introducing spurious signals into the circuitry.

OBJECTS OF THE INVENTION

It is therefore a broad object of my invention to provide a method for determining whether cavities in a cabinet housing electronic circuitry, whether existing or planned, may be susceptible to introducing resonant conditions inadvertently and to take corrective action at either planning or remedial stages.

It is another object of my invention to provide such a method by which any cavities which may be present in a cabinet housing electronic circuitry may be planned or revised to substantially eliminate the possibility of decreasing the reliability of the housed electronic system which might otherwise result from the inadvertent establishment of resonance conditions in the cavity.

In a more specific aspect, it is an object of my invention to determine (using known operational criteria for a given housed electronic system and employing certain formulas) the maximum allowable dimension for a given cavity in a cabinet and ensure that the actual largest dimension of the cavity is smaller.

In another aspect, it is an object of my invention to make such a maximum dimension determination for any suspect cavities within an existing cabinet housing electronics circuitry and to subdivide the cavity employing electronically conductive baffles in order to raise the resonant frequency of any cavity remaining within the cabinet above the critical value.

SUMMARY OF THE INVENTION

Briefly, these and other objects of my invention are achieved by determining the maximum repetition rate or frequency for legitimate signals which can appear in the circuitry disposed within the cabinet and then establishing the dimensions of each cavity within the cabinet such that each cavity's resonant frequency is higher than the critical repetition rate/frequency. Since a given cavity in a cabinet is typically block-shaped (such as the space between a cabinet door and the circuit panel facing the door), a special purpose formula may be employed to obtain a good approximation of the cavity's resonant frequency, and the cavity dimensions then adjusted to raise the cavity resonant frequency above the critical frequency. For the still more particular, but prevalent, cavity configuration in which the length is greater than the width which is much greater than the depth, a still more simplified formula can be employed to find an approximate cavity resonant frequency. In addition, for the common configuration in which one or more intrusions, such as block-shaped packs of electronic circuitry, reduce the cavity volume, a more complex formula may be employed to find the approximate resonant frequency of the cavity with the cavity dimensions then being adjusted to raise that approximate resonant frequency above the critical frequency. The method may be employed either in the design stage or at a remedial stage and, in either case, electrically conductive baffles may be appropriately emplaced within the cavity to divide it into smaller dimension subcavities and thereby raise the worst case resonant frequency above the maximum repetition rate for legitimate signals.

DESCRIPTION OF THE DRAWING

The subject matter of the invention is particularly pointed out and distinctly claimed in the concluding portion of the specification. The invention, however, both as to organization and method of operation, may best be understood by reference to the following description taken in conjunction with the subjoined claims and the accompanying drawing of which:

FIG. 1 is a perspective view of the exterior of an exemplary computer system cabinet incorporating several access doors and which is representative of the environments in which the subject invention may be practiced;

FIG. 2 is a partial view of the cabinet shown in FIG. 1 and illustrates an upper, center door in its opened position to reveal a cavity behind the door and electronic circuitry facing outwardly in the more or less conventional fashion;

FIG. 3 is a cross sectional view taken along the lines 3—3 of FIG. 2 to more clearly illustrate the exemplary cavity;

FIG. 4 is a laid-out representation of the exemplary cavity and its boundaries as conceptually removed from the cabinet for purposes of analysis and discussion;

FIG. 5 is a view similar to FIG. 4, but also shows an exemplary volume-reducing intrusion into the cavity;

FIG. 6 is a view similar to FIG. 2 illustrating the addition of compartment baffles which have been added in accordance with the present invention;

FIG. 7 is a view taken along the lines 7—7 of FIG. 6 illustrating the vertical baffle employed; and FIG. 8 is a cross sectional view taken along the lines 8—8 of FIG. 6 illustrating the horizontal baffle employed to effect the desired resonance inhibition.

DETAILED DESCRIPTION OF THE INVENTION

Referring now to FIG. 1, there is shown a cabinet 1 which, for purposes of example, houses a computer system or subsystem operating at a high clock rate. In the typical configuration shown, the left and right doors 2, 3 are full-height whereas the center section includes a lower door panel 4 and an upper door panel 5 which will be examined more particularly in the explanation of the invention to follow.

Thus, FIG. 2 is an enlarged view of the region of the cabinet 1 occupied by the door 5 and is illustrated with the door opened to reveal electronic circuitry, such as circuit packs 6, emplaced on an outwardly facing circuit panel 7. Referring also to FIG. 3, it will be observed that the region between the circuit panel 7 and the rear 8 of the cabinet 1 is substantially filled with closely packed electronic, mechanical and other structure 9 and, specifically for purposes of explaining the present invention, does not contain any cavities of sufficient size to be a cause for concern. However, the cavity 10 disposed between the circuit panel 7 and the door 5 will, when the door 5 is closed, present a region at which undesired and potentially deleterious resonance conditions may arise. This is the exemplary cavity to be discussed below.

As those skilled in the art will appreciate, cavities of this nature are usually found behind access doors and may also be present in other regions of a cabinet containing electronic circuitry operating at high signal rates. It will be understood that the cavity 10 has definite physical boundaries; i.e., the door 5, the circuit panel 7, intra- or inter-cabinet separators 11 effecting left and right physical boundaries and top 12 and bottom 13 cabinet sections. Thus, the most common configuration for a cavity of sufficient size to be of concern may be deemed to be generally block-shaped and is likely to have one or more "intrusions" into the cavity volume such as the circuit packs 6 which are themselves typically shallow blocks in configuration.

Consider now, with reference to FIG. 4, that, for purposes of analysis, the cavity 10 has been isolated, complete with its physical boundaries 11, 12, 13, and reoriented for convenience by "laying it down". It will be seen that the cavity is substantially block-shaped and that its length c, is greater than its width a which is considerably greater than its depth b. Again, those skilled in the art will appreciate that most cavities in cabinets housing electronic circuitry and of sufficient size to be of concern can be reasonably approximated by this particular shape. It can be shown that the resonant frequency of a cavity of this configuration is sufficiently closely approximated, for the purpose and considering the $TE_{101}$ mode, by the simplified formula:

$$f_r = 1.5\times 10^8((1/a)^2+(1/c)^2)^{1/2}\text{ Hz}$$

where a is the cavity width dimension in meters and c is the cavity length dimension in meters.

Consider a specific example in which width dimension a is one meter and length dimension c is two meters. The approximate resonant frequency of the cavity is therefore:

$$f_r = 1.5\times 10^8((1/1)^2+(\tfrac{1}{2})^2)^{1/2}\text{ Hz}$$

$$f_r = 1.5\times 10^8+(1.707)^{1/2}\text{ Hz}$$

$$f_r = 196\text{ MHz}$$

Thus, if the cabinet 1 is housing electronic circuitry such as an information processing system employing a clock circuitry of, merely by way of example, 200 MHz, the possibility of establishing a spurious resonance conditions within the cabinet because of the presence of cavity 10 exists and must be addressed.

The fundamental preventative or remedial action is to subdivide a cavity of suspect size into a plurality of subcavities. Referring to FIGS. 6, 7 and 8, in the example in which the resonant frequency of the cavity 10 is about 196 MHz, and the clock frequency of the electronic circuitry enclosed in the cabinet 1 is 200 MHz, horizontal baffle 14 may be provided and situated intermediate the top 12 and bottom 13 boundaries of the cavity between the circuit panel 7 and the door 5 into two smaller components, each of which has a resonant frequency higher than the critical frequency. If the critical frequency were higher yet, vertical baffle 15 may be employed to further subdivide this space into a plurality of smaller cavities. In effect, the cavity dimensions are revised to raise the subcavities, resonant frequencies above the critical frequency. Thus, if the single horizontal baffle 14 is used to subdivide the cavity 10 equally (which is not a constraint) the resonant frequency of each subcavity is:

$$f_r = 1.5\times 10^8((1/1)^2+(1/1)^2)^{1/2}\text{ Hz}$$

$$f_r = 1.5\times 10^8+(2.0)^{1/2}\text{ Hz}$$

$$f_r = 212\text{ MHz}$$

If the vertical baffle 15 is added, the resonant frequency of each subcavity is:

$$f_r = 1.5\times 10^8((1/0.5)^2+(1/1)^2)^{1/2}\text{ Hz}$$

$$f_r = 1.5\times 10^8+(2.414)^{1/2}\text{ Hz}$$

$$f_r = 233\text{ MHz}$$

As those skilled in the art will appreciate, the baffles employed should be fabricated from electrically conductive material (or at least have an external or internal electrically conductive layer), and all should preferably be at the same potential (such as ground) to effectively constitute cavity boundaries. Care must also be taken that, in the case of a baffle edge abutting a door or other movable panel effecting a cavity boundary, none or very little space exists between the baffle edge and the movable panel. As shown in FIGS. 7 and 8, an elastic conductive material, such as conductive elastomer strips 16, 17, may be adhesively secured to the baffle edges to ensure that no cavities of very small depth remain since, as will be understood from the simplified equation discussed above, such a cavity could still be the source of spurious resonance conditions.

For some cavities, of course, other modes, such as $TE_{111}$, must be considered, and a more exact formula must be employed as follows:

$$f_r = 1.5\times 10^8((1/a)^2+(1/c)^2)^{1/2}\text{ Hz}$$

where a is the cavity width dimension in meters, b is the cavity depth dimension in meters and c is the cavity length dimension in meters. For example, if a is one meter, b is one-half meter and c is two meters:

$$f_r = 1.5\times 10^8+(3.121)^{178}\text{ Hz}$$

$$f_r = 265\text{ MHz}$$

The formulas employed in the examples given above are simplifications of the more complete expression for the transverse electric field case (in which the E-field is transverse the z-direction and the H-field has components $H_x$ and $H_z$):

$$(f_r)_{mnp}=(1/(2Pi)(mue)^{\frac{1}{2}})((mPi/a)^2+(nPi/b)^2+(pPi/c)^2)^{\frac{1}{2}}$$

where:

n is the number of half cycles of variation in the X direction;

m is the number of half cycles of variation in the Y direction;

p is the number of half cycles of variation in the Z direction;

$1/(\text{mu e})^{\frac{1}{2}}$ is the propagation rate in air $=3\times10^8$ m/s;

a is the cavity width in meters;

b is the cavity depth in meters; and c is the cavity length in meters.

The case in which there are one or more significant intrusions into the cavity must also be considered. For example, as shown in FIGS. 7 and 8, the circuit packs 6 constitute such intrusions which somewhat decrease the cavity volume. Referring to FIG. 5, consider the case in which an intrusion having boundaries defined by dimensions $a_1$, $b_1$ and $c_1$ intrude upon the cavity 10 having boundaries defined by dimensions a, b and c as previously described. The resonant frequency of the reduced-volume cavity 10' may be approximated by the formula:

An expression* for the perturbed resonant frequency is $$\frac{\omega-\omega_o}{\omega_o}\approx\frac{\frac{1}{4}\iiint_{\Delta\tau}(\mu|\overline{H}_o|^2-\epsilon|\underline{E}_o|^2)d\tau}{\frac{1}{4}\iiint_{\tau}(\mu|\overline{H}_o|^2+\epsilon|\overline{E}_o|^2)d\tau}$$

ω: perturbed resonant frequency

Δτ: indentation volume

τ: original unindented volume

For the $TE_{101}$ mode:

$E_x = E_z = H_y = 0$ $E_y$ is of the form $$-A_n\sin\left(\frac{\pi x}{a}\right)\sin\left(\frac{\pi z}{c}\right)$$

$H_x$ is of the form $$\frac{jA_n}{\omega_r\mu_o}\,\frac{\pi}{c}\,\text{Sin}\left(\frac{\pi x}{a}\right)\cos\frac{\pi z}{c}$$

$H_z$ is of the form $$-j\frac{A_n}{\omega_r\mu_o}\,\frac{\pi}{a}\cos\left(\frac{\pi x}{a}\right)\sin\frac{\pi z}{c}$$

At resonance -

$$\iiint_{\tau}\frac{\mu}{4}|\overline{H}_o|^2d\tau=\iiint_{\tau}\frac{\epsilon_o}{4}|\overline{E}_o|^2d\tau$$

$\overline{H}_o$ = peak $H$ of unperturbed field

-continued $$\epsilon_o\int_o^c\int_o^b\int_o^a|E_o|^2d\tau=$$

$$\epsilon_o\iiint|A_n|^2\sin^2\left(\frac{\pi x}{a}\right)\left(\sin^2\frac{\pi z}{c}\right)dxdydz=\epsilon_o|A_n|^2\frac{abc}{4}$$

The denominator of $\frac{\omega-\omega_o}{\omega}$ becomes:

$(\frac{1}{4})\epsilon_o|A_n|^2abc$

For the numerator of $\frac{\omega-\omega_o}{\omega}$:

At $x = a/2,\ y = 0,\ z = c/2$ $$E_y\approx-A_n\sin\left(\frac{\pi}{a}\,\frac{a}{2}\right)\sin\left(\frac{\pi}{c}\,\frac{c}{2}\right)=-A_n$$

$$H_x=\frac{jA_n}{\omega r\mu_o}\,\frac{\pi}{c}\sin\left(\frac{\pi}{a}\,\frac{a}{2}\right)\cos\left(\frac{\pi}{c}\,\frac{c}{2}\right)=0$$

$$H_z=\frac{-jA_n}{\omega r\mu_o}\,\frac{\pi}{a}\cos\left(\frac{\pi}{a}\,\frac{a}{2}\right)\sin\left(\frac{\pi}{c}\,\frac{c}{2}\right)=0$$

Therefore $H_x$, $H_y$, and $H_z$ are zero at the center and approximately throughout the perturbed region.

$$\therefore\iiint_{\Delta\tau}\mu_o|H_o|^2d\tau\approx0$$

Then -

$$\iiint_{\Delta\tau}\epsilon_o|\overline{E}_o|^2d\tau=$$

$$\epsilon_o\int_{y=0}^{y=b_1}\int_{\frac{c-c_1}{2}}^{\frac{c+c_1}{2}}\int_{\frac{a-a_1}{2}}^{\frac{a+a_1}{2}}|A_n|^2\sin^2(\pi/a)(a/2)\sin^2(\pi/c)(c/2)dxdydz\rightarrow$$

$$\epsilon_o|A_n|^2a_1b_1c_1$$

Numerator of $\frac{\omega-\omega_o}{\omega}$ becomes $-(\frac{1}{4})\epsilon_o|A_n|^2a_1b_1c_1$ Finally:

$$\frac{\omega-\omega_o}{\omega_o}=\frac{-(\frac{1}{4})\epsilon_o|A_n|^2a_1b_1c_1}{(\frac{1}{8})\epsilon_o|A_n|^2abc}$$

$$\frac{\omega-\omega_o}{\omega_o}=\frac{-2\Delta\tau}{\tau}$$

$$\text{or }\omega=\frac{\omega o}{1+\frac{2\Delta\tau}{\tau}}$$

Perturbation example:

if $\Delta\tau = .1\tau$ $$\text{then }\omega=\frac{\omega_o}{1.2}=.83\ \omega_o\rightarrow139\text{ MHz}$$

It will be seen that an intrusion (and there may be several of significance for a given cavity) lowers the resonant frequency of a cavity and therefore tends to aggravate the potential for problems of the nature under consideration. Consequently, care must be taken to account for such intrusions if they are present, and a sufficient number of appropriately placed baffles employed to raise the resonant frequency of all subcavities above the critical frequency.

Those skilled in the ar will appreciate that various cabinet and cavity configurations may indicate that cavity resonance in modes other than TE may have to be considered and calculated in the manner set forth above with the adjustments well known in the art in order to insure that the cavity resonant frequency in all modes is above the critical frequency.

For a more complete exposition of the derivation and basis of the full (i.e., unsimplified) formulas discussed above and for modes in addition to TE, one may refer to *Time Harmonic Electromagnetic Fields* by Roger F. Harrington, (McGraw-Hill, New York, 1961), Chapter 7, pp. 317–321.

Thus, while the principles of the invention have now been made clear in an illustrative embodiment, there will be immediately obvious to those skilled in the art many modifications of structure, arrangements, proportions, the elements, materials, and components, used in the practice of the invention which are particularly adapted for specific environments and operating requirements without departing from those principles.

I claim:

1. The method for eliminating spurious signals induced in digital electronic circuitry operating at high frequency and housed in a cabinet having walls made of an electrically conductive material, said walls defining an enclosed cavity having a resonant frequency, said spurious signals being induced in the digital electronic circuitry by transient standing electromagnetic waves developed in the enclosed cavity derived from operation of the electronic circuitry, the frequency of said standing electromagnetic waves being the resonant frequency of the enclosed cavity; the steps comprising:

A) determining the maximum frequency of the digital electronic circuitry housed in the cabinet;

B) determining the resonant frequency of the enclosed cavity;

C) comparing the maximum frequency of the electronic circuitry with the resonant frequency of the enclosed cavity;

D) dividing the cavity into a plurality of subcavities by emplacing electrically conductive baffles into the cavity if the resonant frequency of the enclosed cavity does not substantially exceed the maximum frequency of the electronic circuitry;

E) determining the resonant frequency of each of the subcavities;

F) comparing the maximum frequency of the electronic circuitry with the resonant frequency of each of the subcavities;

G) dividing each subcavity whose resonant frequency is less than the maximum frequency of the digital electronic circuitry into smaller subcavities by emplacing electrically conductive baffles into each such subcavity; and H) repeating steps E, F and G with respect to any subcavity whose resonant frequency is less than the maximum frequency of the electronic circuitry until the resonant frequency of every subcavity within the cabinet is greater than the maximum frequency of the digital electronic circuitry.

2. The method of claim 1 in which the walls of the cabinet and the baffles are substantially planar.

3. The method of claim 2 in which the walls of the cabinet and baffles are electrically interconnected and maintained at substantially ground potential.

4. The method of claim 3 in which the electronic circuitry is a synchronous data processing system the clock frequency of which is the maximum frequency.

5. A method for eliminating a source of spurious signals in digital electronic circuitry operating at a high frequency and housed in a cabinet having walls made of electrically conductive material defining an enclosed cavity comprising the steps of:

A) determining the maximum frequency of the digital electronic circuitry housed in the cabinet;

B) determining the dimensions of the enclosed cavity;

C) determining the resonant frequency of the enclosed cavity using the dimensions of the enclosed cavity determined in step B;

D) comparing the maximum frequency of the digital electronic circuitry obtained in step A with the resonant frequency of the enclosed cavity obtained in step C;

E) dividing the cavity into subcavities by emplacing electrically conductive baffles into the cavity if the maximum frequency of the digital electronic circuitry exceeds the resonant frequency of the enclosed cavity;

F) determining the dimensions of each subcavity and the resonant frequency of each subcavity;

G) comparing the maximum frequency of the digital electronic circuitry with the resonant frequency of each subcavity;

H) dividing each subcavity whose resonant frequency is less than the maximum frequency of the digital electronic circuit into smaller subcavities by emplacing electrically conductive baffles into each subcavity whose resonant frequency does not exceed the maximum frequency of the digital electronic circuitry; and I) repeating steps F, G and H until the resonant frequency of every subcavity is greater than the maximum frequency of the digital electronic circuitry.

6. The method of claim 5 in which the walls of the cabinet and the baffles are substantially planar.

7. The method of claim 6 in which the walls of the cabinet and baffles are electrically interconnected and maintained at substantially ground potential.

8: The method of claim 7 in which the digital electronic circuitry is a synchronous data processing system the clock frequency of which is the maximum frequency.

* * * * *